(12) United States Patent
Ju et al.

(10) Patent No.: US 10,089,955 B2
(45) Date of Patent: Oct. 2, 2018

(54) DATA PROCESSING APPARATUS CAPABLE OF USING DIFFERENT COMPRESSION CONFIGURATIONS FOR IMAGE QUALITY OPTIMIZATION AND/OR DISPLAY BUFFER CAPACITY OPTIMIZATION AND RELATED DATA PROCESSING METHOD

(71) Applicant: MEDIATEK INC., Hsin-Chu (TW)

(72) Inventors: Chi-Cheng Ju, Hsinchu (TW); Tsu-Ming Liu, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/106,312

(22) PCT Filed: Mar. 18, 2015

(86) PCT No.: PCT/CN2015/074432
§ 371 (c)(1),
(2) Date: Jun. 19, 2016

(87) PCT Pub. No.: WO2015/139627
PCT Pub. Date: Sep. 24, 2015

(65) Prior Publication Data
US 2017/0032491 A1 Feb. 2, 2017

Related U.S. Application Data

(60) Provisional application No. 61/954,667, filed on Mar. 18, 2014.

(51) Int. Cl.
*G09G 5/00* (2006.01)
*H04N 19/00* (2014.01)
(Continued)

(52) U.S. Cl.
CPC ............... *G09G 5/006* (2013.01); *G06F 3/14* (2013.01); *G06F 3/1415* (2013.01); *G06F 11/00* (2013.01);
(Continued)

(58) Field of Classification Search
None
See application file for complete search history.

(56) References Cited

U.S. PATENT DOCUMENTS

| 5,864,345 A | 1/1999 | Wickstrom |
| 5,907,374 A | 5/1999 | Liu |

(Continued)

FOREIGN PATENT DOCUMENTS

| CN | 101110958 A | 1/2008 |
| CN | 101237582 A | 8/2008 |

(Continued)

OTHER PUBLICATIONS

"International Search Report" dated Jul. 31, 2015 for International application No. PCT/CN2015/074433, International filing date:Mar. 18, 2015.

(Continued)

*Primary Examiner* — Yi Wang
(74) *Attorney, Agent, or Firm* — Winston Hsu

(57) ABSTRACT

A data processing apparatus has a first compressor, a second compressor, a first output interface, and a second output interface. The first compressor performs compression upon a first portion of an input display data of a frame to generate a first compressed display data, wherein the compression performed upon the first portion of the input display data has a first compression configuration. The second compressor performs compression upon a second portion of the input display data of the frame to generate a second compressed display data, wherein the compression performed upon the (Continued)

second portion of the input display data has a second compression configuration. The first output interface transmits the first compressed display data over a first display port of a display interface. The second output interface transmits the second compressed display data over a second display port of the display inter face.

7 Claims, 5 Drawing Sheets

(51) Int. Cl.
    *G06F 11/00* (2006.01)
    *G06F 11/07* (2006.01)
    *G06F 3/14* (2006.01)
    *H04N 19/66* (2014.01)
    *G06F 11/10* (2006.01)
    *H03M 13/00* (2006.01)
    *G09G 5/04* (2006.01)
    *G09G 5/14* (2006.01)
    *H04N 19/436* (2014.01)
    *H04N 19/86* (2014.01)
    *G06F 13/42* (2006.01)
    *H04N 19/426* (2014.01)
    *G06T 1/60* (2006.01)

(52) U.S. Cl.
    CPC ...... *G06F 11/0733* (2013.01); *G06F 11/0793* (2013.01); *G06F 11/10* (2013.01); *G06F 13/4282* (2013.01); *G06T 1/60* (2013.01); *G09G 5/04* (2013.01); *G09G 5/14* (2013.01); *H03M 13/6312* (2013.01); *H04N 19/00* (2013.01); *H04N 19/426* (2014.11); *H04N 19/436* (2014.11); *H04N 19/66* (2014.11); *H04N 19/86* (2014.11); *G09G 2310/0264* (2013.01); *G09G 2320/0606* (2013.01); *G09G 2320/0686* (2013.01); *G09G 2330/021* (2013.01); *G09G 2340/02* (2013.01); *G09G 2360/08* (2013.01); *G09G 2370/00* (2013.01); *Y02D 10/14* (2018.01); *Y02D 10/151* (2018.01)

(56) References Cited

U.S. PATENT DOCUMENTS

| | | | |
|---|---|---|---|
| 5,970,233 A | 10/1999 | Liu | |
| 6,320,907 B1 * | 11/2001 | Pau | G06T 9/008 375/240.03 |
| 6,385,571 B1 | 5/2002 | Heo | |
| 6,389,174 B1 | 5/2002 | Liu | |
| 6,539,120 B1 | 3/2003 | Sita | |
| 2003/0002583 A1 | 1/2003 | Geerlings | |
| 2003/0142864 A1 | 7/2003 | Bezryadin | |
| 2003/0206717 A1 | 11/2003 | Yogeshwar | |
| 2004/0150747 A1 | 8/2004 | Sita | |
| 2008/0170626 A1 | 7/2008 | Sung | |
| 2008/0304709 A1 | 12/2008 | Huang | |
| 2008/0304738 A1 | 12/2008 | Beilloin | |
| 2009/0174811 A1 | 7/2009 | Sung | |
| 2011/0216162 A1 | 9/2011 | Filippini | |
| 2011/0242112 A1 | 10/2011 | Katayama | |
| 2011/0310980 A1 | 12/2011 | Mathew | |
| 2013/0235039 A1 | 9/2013 | Montag | |
| 2013/0243100 A1 | 9/2013 | Liu | |
| 2013/0322515 A1 | 12/2013 | Tung | |
| 2014/0057549 A1 * | 2/2014 | Ling | H04H 20/74 455/3.02 |
| 2014/0098111 A1 | 4/2014 | Ju | |
| 2014/0247983 A1 | 9/2014 | MacInnis | |
| 2015/0156469 A1 | 6/2015 | Qu | |
| 2017/0070743 A1 | 3/2017 | Zhou | |

FOREIGN PATENT DOCUMENTS

| | | |
|---|---|---|
| CN | 101854508 A | 10/2010 |
| CN | 102625106 A | 8/2012 |
| CN | 102665135 A | 9/2012 |
| CN | 102681812 A | 9/2012 |
| CN | 103167218 A | 6/2013 |
| CN | 103167281 A | 6/2013 |
| CN | 103347163 A | 10/2013 |
| CN | 103428528 A | 12/2013 |
| EP | 0 517 383 A2 | 12/1992 |
| WO | 2014056406 A1 | 4/2014 |

OTHER PUBLICATIONS

"International Search Report" dated Jun. 17, 2015 for International application No. PCT/CN2015/074432, International filing date:Mar. 18, 2015.

"International Search Report" dated Jul. 22, 2015 for International application No. PCT/CN2015/074448, International filing date:Mar. 18, 2015.

"International Search Report" dated Aug. 5, 2015 for International application No. PCT/CN2015/074430, International filing date:Mar. 18, 2015.

Richard Lawrence, High-Speed Serial Interface for Mobile Displays, DES4-1, IDW'S 06, Proceedings of The 13th International Display Workshops, vol. 3, XP008130948, Dec. 6-8, 2006, Otsu, Japan.

J. Meehan et al., Multimedia IP architecture trends in the mobile multimedia consumer device, Signal Processing: Image Communication, 2010 Elsevier B.V., XP027080310, pp. 317-324, Jun. 1, 2010.

Pierre De Greef et al., P-49: Integrated DisplayPort TCON Device with Vibrant Picture Quality Features, SID 09 Digest, XP007017408, May 31, 2009, pp. 1275-1278.

* cited by examiner

US 10,089,955 B2

DATA PROCESSING APPARATUS CAPABLE OF USING DIFFERENT COMPRESSION CONFIGURATIONS FOR IMAGE QUALITY OPTIMIZATION AND/OR DISPLAY BUFFER CAPACITY OPTIMIZATION AND RELATED DATA PROCESSING METHOD

CROSS REFERENCE TO RELATED APPLICATIONS

This application claims the benefit of U.S. provisional application No. 61/954,667, filed on Mar. 18, 2014 and incorporated herein by reference.

TECHNICAL FIELD

The disclosed embodiments of the present invention relate to transmitting display data over a display interface, and more particularly, to a data processing apparatus capable of using different compression configurations for image quality optimization and/or display buffer capacity optimization and a related data processing method.

BACKGROUND

A display interface is disposed between a first chip and a second chip to transmit display data from the first chip to the second chip for further processing. For example, the first chip may be a host application processor, and the second chip may be a driver integrated circuit (IC). The display data may include image data, video data, graphic data, and/or OSD (on-screen display) data. Besides, the display data may be single view data for two-dimensional (2D) display or multiple view data for three-dimensional (3D) display. When a display panel supports a higher display resolution, 2D/3D display with higher resolution can be realized. Hence, the display data transmitted over the display interface would have a larger data size/data rate, which increases the power consumption of the display interface inevitably. If the host application processor and the driver IC are both located at a portable device (e.g., a smartphone) powered by a battery device, the battery life is shortened due to the increased power consumption of the display interface. Thus, there is a need for an innovative design which can effectively reduce the power consumption of the display interface.

SUMMARY

In accordance with exemplary embodiments of the present invention, a data processing apparatus capable of using different compression configurations for image quality optimization and/or display buffer capacity optimization and a related data processing method are proposed.

According to a first aspect of the present invention, an exemplary data processing apparatus is disclosed. The exemplary data processing apparatus includes a first compressor, a second compressor, a first output interface, and a second output interface. The first compressor is arranged to perform compression upon a first portion of an input display data of a frame to generate a first compressed display data, wherein the compression performed upon the first portion of the input display data has a first compression configuration. The second compressor is arranged to perform compression upon a second portion of the input display data of the frame to generate a second compressed display data, wherein the compression performed upon the second portion of the input display data has a second compression configuration. The first output interface is arranged to pack a first output display data derived from the first compressed display data into a first output bitstream, and output the first output bitstream via a first display port of a display interface. The second output interface is arranged to pack a second output display data derived from the second compressed display data into a second output bitstream, and output the second output bitstream via a second display port of the display interface. The first display port is different from the second display port, and the first compression configuration is different from the second compression configuration.

According to a second aspect of the present invention, an exemplary data processing apparatus is disclosed. The exemplary data processing apparatus includes a compressor and an output interface. The compressor is arranged to perform compression upon an input display data to generate a compressed display data. The output interface is arranged to pack an output display data derived from the compressed display data into an output bitstream, and output the output bitstream to another data processing apparatus via a display interface. When the another data processing apparatus is operated under a first mode to drive a display apparatus through a first hardware configuration of the another data processing apparatus, the compression performed by the compressor has a first compression configuration. When the another data processing apparatus is operated under a second mode to drive the display apparatus through a second hardware configuration of the another data processing apparatus, the compression performed by the compressor has a second compression configuration. The first hardware configuration is different from the second hardware configuration, and the first compression configuration is different from the second compression configuration.

According to a third aspect of the present invention, an exemplary data processing apparatus is disclosed. The exemplary data processing apparatus includes an input interface, a first de-compressor, a display buffer, a compressor, and a second de-compressor. The input interface is arranged to receive an input bitstream via a display interface, and un-pack the input bitstream into an input display data. The first de-compressor is arranged to perform decompression upon a first compressed display data derived from the input display data to generate a first de-compressed display data. The compressor is arranged to perform compression upon the first de-compressed display data to generate a second compressed display data to the display buffer, wherein a data size of the second compressed display data is different from a data size of the first compressed display data. The second de-compressor is arranged to perform decompression upon the second compressed display data read from the display buffer to generate a second de-compressed display data.

According to a fourth aspect of the present invention, an exemplary data processing method is disclosed. The exemplary data processing method includes: utilizing a first compressor to perform compression upon a first portion of an input display data of a frame to generate a first compressed display data, wherein the compression performed upon the first portion of the input display data has a first compression configuration; utilizing a second compressor to perform compression upon a second portion of the input display data of the frame to generate a second compressed display data, wherein the compression performed upon the second portion of the input display data has a second compression configuration; packing a first output display data derived from the first compressed display data into a first output bitstream, and outputting the first output bitstream via a first display port of a display interface; and packing a second output display data derived from the second compressed display data into a second output bitstream, and outputting the second output bitstream via a second display port of the display interface. The first display port is different from the second display port, and the first compression configuration is different from the second compression configuration.

According to a fifth aspect of the present invention, an exemplary data processing method is disclosed. The exemplary data processing method includes: utilizing a compressor to perform compression upon an input display data to generate a compressed display data; and packing an output display data derived from the compressed display data into an output bitstream, and outputting the output bitstream to another data processing apparatus via a display interface. When the another data processing apparatus is operated under a first mode to drive a display apparatus through a first hardware configuration of the another data processing apparatus, the compression performed by the compressor has a first compression configuration. When the another data processing apparatus is operated under a second mode to drive the display apparatus through a second hardware configuration of the another data processing apparatus, the compression performed by the compressor has a second compression configuration. The first hardware configuration is different from the second hardware configuration, and the first compression configuration is different from the second compression configuration.

According to a sixth aspect of the present invention, an exemplary data processing method is disclosed. The exemplary data processing method includes: receiving an input bitstream via a display interface, and un-packing the input bitstream into an input display data; performing decompression upon a first compressed display data derived from the input display data to generate a first de-compressed display data; utilizing a compressor to perform compression upon the first de-compressed display data to generate a second compressed display data to a display buffer, wherein a data size of the second compressed display data is different from a data size of the first compressed display data; and performing decompression upon the second compressed display data read from the display buffer to generate a second de-compressed display data.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The concept of the present invention is to apply data compression upon display data and then transmit compressed display data over a display interface. As the data size/data rate of the compressed display data is smaller than that of the original un-compressed display data, the power consumption of the display interface is reduced correspondingly.

A display area of a display panel may be divided into a plurality of partial display regions, and the partial display regions may be driven by a plurality of display driver integrated circuits (DDICs). The display data compression may employ a lossy compression algorithm, resulting in artifacts in the partial display regions of the display panel. However, statically applying the compression configuration to different signal paths associated with driving of the partial display regions is not an optimized way. The present invention therefore proposes employing different compression configurations according to different display ports.

In addition, a DDIC may be controlled to operate in a plurality of display driving modes, such as a video mode and an image/command mode. The display data compression may employ a lossy compression algorithm, resulting in artifacts of a display area driven under a selected display driving mode, such as the video mode or the image/command mode. Further, the DDIC in the video mode does not need to store display data into a display buffer, while the DDIC in the image/command mode has to store display data into the display buffer. Hence, the video mode and the image/command mode may correspond to different buffer capacity requirements. Statically applying the compression configuration to different signal paths associated with the video mode and the image/command mode is not an optimized way. The present invention further proposes employing different compression configurations according to different display driving modes (e.g., video mode and image/command mode).

Further details of the display data compression design with optimized compression paths for different display ports and/or different display driving modes are described as below.

Figure 1:
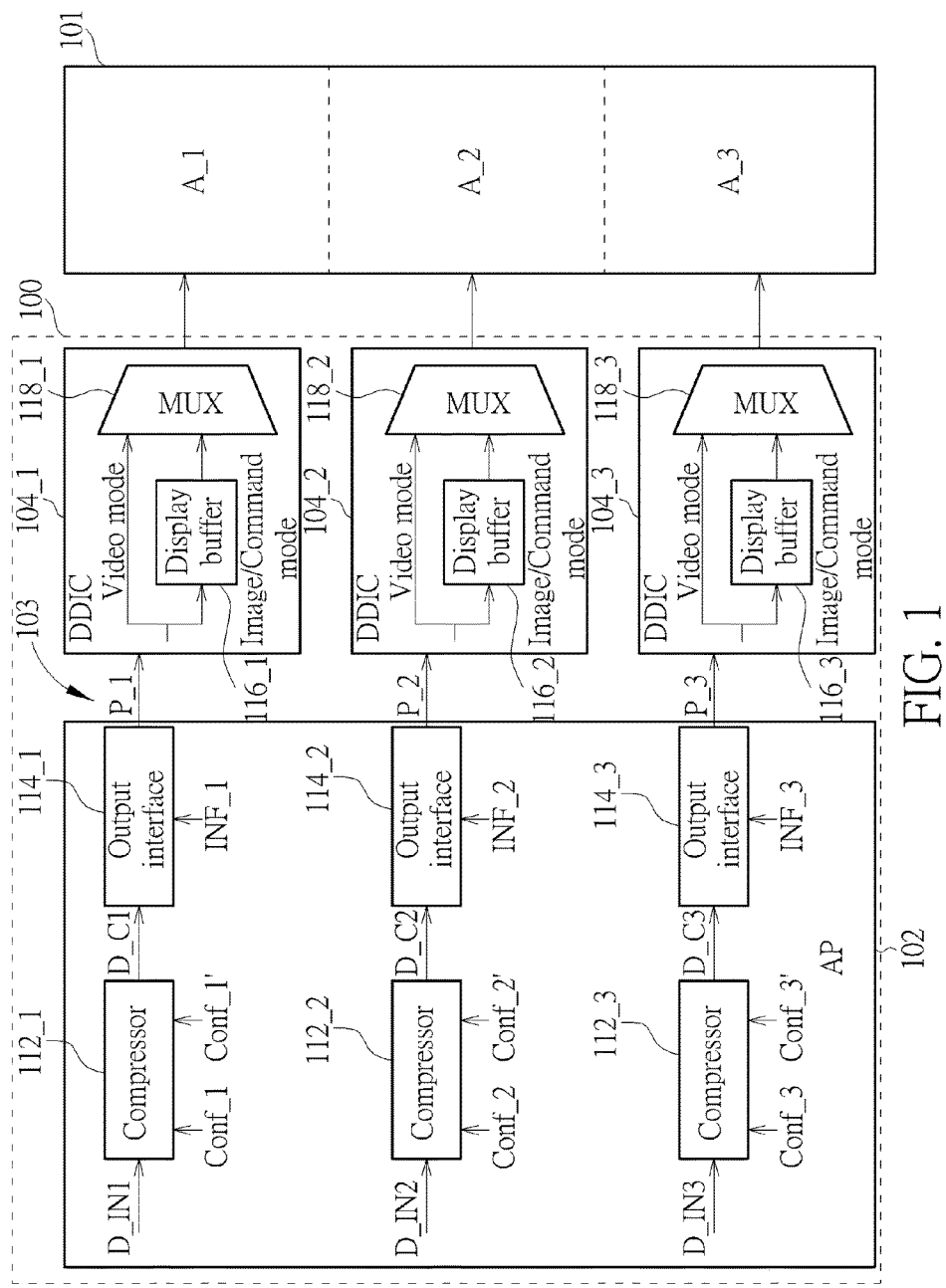
FIG. 1 is a block diagram illustrating a data processing system according to an embodiment of the present invention.

FIG. 1 is a block diagram illustrating a data processing system according to an embodiment of the present invention. The data processing system 100 includes a plurality of data processing apparatuses such as an application processor (AP) 102 and a plurality of display driver integrated circuits (DDICs) 104_1, 104_2, 104_3. The AP 102 and the DDICs 104_1-104_3 may be implemented in different chips, and the AP 102 communicates with the DDICs 104_1-104_3 via a display interface 103. In this embodiment, the display interface 103 may be a display serial interface (DSI) standardized by a Mobile Industry Processor Interface (MIPI) or an embedded display port (eDP) standardized by a Video Electronics Standards Association (VESA).

Since there are three DDICs implemented in the data processing system 100, the AP 102 is coupled to the DDICs 104_1, 104_2, 104_3 through three display ports P_1, P_2, P_3 of the display interface 103. The display ports P_1-P_3 correspond to a plurality of partial display regions A_1, A_2, A_3 of a display panel 101, respectively. More specifically, the DDICs 104_1-104_3 are used to drive the partial display regions A_1-A_3 of the display panel 101, respectively. In addition, the AP 102 may process three partial display data of each frame separately, where the display data D_IN1 may include one of the three partial display data (i.e., the display data of one partial region of a frame), the display data D_IN2 may include another of the three partial display data (i.e., the display data of another partial region of the frame), and the display data D_IN3 may include the other of the three partial display data (i.e., the display data of the other partial region of the frame). Each of the display data D_IN1-D_IN3 may include image data, video data, graphic data, and/or OSD data. Further, each of the display data D_IN1-D_IN3 may be single view data for 2D display or multiple view data for 3D display. It should be noted that the configuration shown in FIG. 1 is for illustrative purposes only, and is not meant to be a limitation of the present invention. For example, the number of DDICs and the number of partial display regions driven by DDICs may be adjusted, depending upon actual design consideration.

The AP 102 includes a plurality of compressors 112_1, 112_2, 112_3 and a plurality of output interfaces 114_1, 114_2, 114_3. Each of the DDIC 104_1-104_3 is controlled to operate in one of a plurality of display driving modes (e.g., a video mode and an image/command mode). The DDIC 104_1 has a display buffer 116_1 and a multiplexer (MUX) 118_1. The DDIC 104_2 has a display buffer 116_2 and a multiplexer (MUX) 118_2. The DDIC 104_3 has a display buffer 116_3 and a multiplexer (MUX) 118_3. Each of the display buffers 116_1-116_3 is arranged for storing a display data to thereby provide a buffered display data under the image/command mode, wherein the display data stored into the display buffer may be an un-compressed display data, a compressed display data or a de-compressed display data, depending upon actual design consideration/requirement. When a DDIC (e.g., one of 104_1, 104_2, and 104_3) is operated in a video mode, a multiplexer (e.g., one of 118_1, 118_2, and 118_3) in the DDIC selects a display data not stored into a display buffer (e.g., one of 116_1, 116_2, and 116_3) in the DDIC as an output used for driving a corresponding partial display region (e.g., one of A_1, A_2, and A_3) of the display panel 101. When the DDIC (e.g., one of 104_1, 104_2, and 104_3) is operated in an image/command mode, the multiplexer (e.g., one of 118_1, 118_2, and 118_3) in the DDIC selects a display data read from the display buffer (e.g., one of 116_1, 116_2, and 116_3) in the DDIC as an output used for driving the corresponding partial display region (e.g., one of A_1, A_2, and A_3) of the display panel 101. It should be noted that, after the display data of a frame (i.e., a still image) has been stored in the display buffer (e.g., one of 116_1, 116_2, and 116_3) of the DDIC, the compressed data transmission over a display port (e.g., one of P_1, P_2, and P_3) may be stopped for achieving power saving.

The compressor 112_1 is arranged to perform compression upon a portion of an input display data of a frame (e.g., display data D_IN1) to generate a compressed display data D_C1, where the compression performed upon the display data D_IN1 has a compression configuration Conf_1/Conf_1'. The output interface 114_1 is arranged to pack an output display data derived from the compressed display data D_C1 into an output bitstream, and output the output bitstream to the DDIC 104_1 via the display port P_1 of the display interface 103.

The compressor 112_2 is arranged to perform compression upon another portion of the input display data of the frame (e.g., display data D_IN2) to generate a compressed display data D_C2, where the compression performed upon the display data D_IN2 has a compression configuration Conf_2/Conf_2'. The output interface 114_2 is arranged to pack an output display data derived from the compressed display data D_C2 into an output bitstream, and output the output bitstream to the DDIC 104_2 via the display port P_2 of the display interface 103.

The compressor 112_3 is arranged to perform compression upon the other portion of the input display data of the frame (e.g., display data D_IN3) to generate a compressed display data D_C3, where the compression performed upon the display data D_IN3 has a compression configuration Conf_3/Conf_3'. The output interface 114_3 is arranged to pack an output display data derived from the compressed display data D_C3 into an output bitstream, and output the output bitstream to the DDIC 104_3 via the display port P_3 of the display interface 103.

Since user's vision is more likely to focus on the central partial display region A_2 of the display panel 101, artifacts occurring in the central partial display region A_2 would be more visible to user's eyes than artifacts occurring in the partial display regions A_1 and A_3 on different sides of the central partial display region A_2. Based on above observation, the present invention does not employ the same display data compression configuration to process all of the display data D_IN1-D_IN3 intended to be displayed on the partial display regions A_1-A_3 of the display panel 101. For example, compared to the lossy compression applied to the display data D_IN1 and D_IN3 intended to be displayed on partial display regions A_1 and A_3, the lossy compression applied to the display data D_IN2 intended to be displayed on the central partial display region A_2 is properly controlled to introduce fewer artifacts.

Further, when a DDIC (e.g., one of 104_1, 104_2, and 104_3) is operated in an image/command mode, a partial display region (e.g., one of A_1, A_2, and A_3) is driven to display a still image, where a display data of the still image is obtained from decompressing a compressed display data transmitted over a display port of the display interface 103. When a DDIC (e.g., one of 104_1, 104_2, and 104_3) is operated in a video mode, a partial display region (e.g., one of A_1, A_2, and A_3) is driven to display a video sequence composed of a plurality of frames, where a display data of each frame of the video sequence is obtained from decompressing a compressed display data transmitted over a display port of the display interface. However, the image quality of the video sequence displayed in the video mode will be degraded due to flicker artifacts. Based on above observation, the present invention does not apply the same display data compression under each of the video mode and the image/command mode. For example, compared to the lossy compression applied to the display data D_IN1-D_IN3 to be displayed in the image/command mode, the lossy compression applied to the display data D_IN1-D_IN3 to be displayed in the video mode is properly controlled to introduce fewer artifacts.

The present invention proposes controlling the compression configurations employed by the compressors 112_1-112_3 in terms of image quality. Hence, the compression configurations are not the same for different display ports and/or different display driving modes. For example, at least one of a rate optimization manner, a bit-depth optimization manner, and a complexity optimization manner may be employed to set the compression configurations of the compressors 112_1-112_3.

In a first exemplary design, the compression configurations may be set based on the rate optimization manner. For example, a mild compression ratio (e.g., a lower compression ratio) is applied to the display data D_IN2 corresponding to a central display port P_2, where a compression ratio may be defined as $$\frac{\text{Uncompressed data size}}{\text{Compressed data size}}.$$

Hence, when the display data compression with a higher compression ratio is employed, more artifacts will be introduced by the display data compression. In one exemplary embodiment, the compression configuration Conf_1 employed by the compressor 112_1 is different from the compression configuration Conf_2 employed by the compressor 112_2, and/or the compression configuration Conf_3 employed by the compressor 112_3 is different from the compression configuration Conf_2 employed by the compressor 112_2. Specifically, each of the compression configurations Conf_1 and Conf_3 includes a first compression ratio, and the compression configuration Conf_2 includes a second compression ratio, where the second compression ratio is different from the first compression ratio. When optimization of the image quality of the partial display regions A_1-A_3 is considered, the second compression ratio (e.g., 2) is lower than the first compression ratio (e.g., 3), thereby reducing the artifacts visible in the central partial display region A_2.

For another example, a mild compression ratio (e.g., a lower compression ratio) is applied to a display data to be displayed in the video mode. As mentioned above, the compression ratio may be defined as $$\frac{\text{Uncompressed data size}}{\text{Compressed data size}}.$$

Hence, when the display data compression with a higher compression ratio is employed, more artifacts will be introduced by the display data compression. Hence, compression configurations of the compressors 112_1-112_3 operated in the video mode should be properly controlled for flicker artifact reduction.

When the DDIC 104_1 is operated under a first mode (e.g., video mode) to drive a display apparatus (e.g., partial display region A_1 of the display panel 101) through a first hardware configuration of the DDIC 104_1, the compression performed by the compressor 112_1 has the compression configuration Conf_1, where the first hardware configuration of the DDIC 104_1 does not use the display buffer 116_1 for display data buffering. When the DDIC 104_1 is operated under a second mode (e.g., image/command mode) to drive the display apparatus (e.g., partial display region A_1 of the display panel 101) through a second hardware configuration of the DDIC 104_1, the compression performed by the compressor 112_1 has the compression configuration Conf_1', where the second hardware configuration of the DDIC 104_1 uses the display buffer 116_1 for display data buffering. In one exemplary embodiment, the compression configuration Conf_1 employed by the compressor 112_1 when the DDIC 104_1 is operated under the video mode is different from the compression configuration Conf_1' employed by the compressor 112_1 when the DDIC 104_1 is operated under the image/command mode. Specifically, the compression configuration Conf_1 includes a first compression ratio, and the compression configuration Conf_1' includes a second compression ratio, where the second compression ratio is different from the first compression ratio. When optimization of the image quality in the video mode is considered, the first compression ratio (e.g., 2) is lower than the second compression ratio (e.g., 3), thereby reducing the flicker artifacts visible in the video mode.

Similarly, when the DDIC 104_2 is operated under a first mode (e.g., video mode) to drive a display apparatus (e.g., partial display region A_2 of the display panel 101) through a first hardware configuration of the DDIC 104_2, the compression performed by the compressor 112_2 has a compression configuration Conf_2, where the first hardware configuration of the DDIC 104_2 does not use the display buffer 116_2 for display data buffering. When the DDIC 104_2 is operated under a second mode (e.g., image/command mode) to drive the display apparatus (e.g., partial display region A_2 of the display panel 101) through a second hardware configuration of the DDIC 104_2, the compression performed by the compressor 112_2 has a compression configuration Conf_2', where the second hardware configuration of the DDIC 104_2 uses the display buffer 116_2 for display data buffering. In one exemplary embodiment, the compression configuration Conf_2 employed by the compressor 112_2 when the DDIC 104_2 is operated under the video mode is different from the compression configuration Conf_2' employed by the compressor 112_2 when the DDIC 104_2 is operated under the image/command mode. Specifically, the compression configuration Conf_2 includes a first compression ratio, and the compression configuration Conf_2' includes a second compression ratio, where the second compression ratio is different from the first compression ratio. When optimization of the image quality of the video mode is considered, the first compression ratio (e.g., 2) is lower than the second compression ratio (e.g., 3), thereby reducing the flicker artifacts visible in the video mode.

When the DDIC 104_3 is operated under a first mode (e.g., video mode) to drive a display apparatus (e.g., partial display region A_3 of the display panel 101) through a first hardware configuration of the DDIC 104_3, the compression performed by the compressor 112_3 has a compression configuration Conf_3, where the first hardware configuration of the DDIC 104_3 does not use the display buffer 116_3 for display data buffering. When the DDIC 104_3 is operated under a second mode (e.g., image/command mode) to drive the display apparatus (e.g., partial display region A_3 of the display panel 101) through a second hardware configuration of the DDIC 104_3, the compression performed by the compressor 112_3 has a compression configuration Conf_3', where the second hardware configuration of the DDIC 104_3 uses the display buffer 116_3 for display data buffering. In one exemplary embodiment, the compression configuration Conf_3 employed by the compressor 112_3 when the DDIC 104_3 is operated under the video mode is different from the compression configuration Conf_3' employed by the compressor 112_3 when the DDIC 104_3 is operated under the image/command mode. Specifically, the compression configuration Conf_3 includes a first compression ratio, and the compression configuration Conf_3' includes a second compression ratio, where the second compression ratio is different from the first compression ratio. When optimization of the image quality in the video mode is considered, the first compression ratio (e.g., 2) is lower than the second compression ratio (e.g., 3), thereby reducing the flicker artifacts visible in the video mode.

In a second exemplary design, the compression configurations may be set based on the bit-depth optimization manner. For example, a full-bit-depth compression is applied to the display data D_IN2 corresponding to the central display port P_2. Considering a case where a 10-bit data source provides a display data to a compressor, one pixel would have a 10-bit pixel data in each color channel. When the compressor employs an 8-bit (partial-bit-depth) compression, a 2-bit pixel data in a 10-bit pixel data of each color channel an uncompressed display data input may be discarded, thus resulting in a 8-bit pixel data left for compression. A 2-bit dithering operation will be performed at the DDIC side to reconstruct each 10-bit pixel data. That is, after a de-compressed display data is generated, a post-processing operation (e.g., a dithering operation) is performed upon the de-compressed display data to convert the de-compressed display data with a partial bit depth in each color channel into a de-compressed display data with a full bit depth in each color channel. As a result, compared to a 10-bit (full-bit-depth) compression, the 8-bit (partial-bit-depth) compression and the 2-bit dithering operation will introduce more artifacts. In one exemplary embodiment, the compression configuration Conf_1 employed by the compressor 112_1 is different from the compression configuration Conf_2 employed by the compressor 112_2, and/or the compression configuration Conf_3 employed by the compressor 112_3 is different from the compression configuration Conf_2 employed by the compressor 112_2. Specifically, each of the compression configurations Conf_1 and Conf_3 includes an N-bit compression operation, and the compression configuration Conf_2 includes an M-bit compression operation, where N and M are different positive values. When optimization of the image quality of the partial display regions A_1-A_3 is considered, the value of N (e.g., 8) is smaller than the value of M (e.g., 10), thereby reducing the artifacts visible in the central partial display region A_2.

For another example, a full-bit-depth compression is applied to a display data to be displayed in the video mode. Consider a case where a 10-bit data source provides a display data to a compressor. Compared to a 10-bit (full-bit-depth) compression, the 8-bit (partial-bit-depth) compression and the 2-bit dithering operation will introduce more artifacts. In one exemplary embodiment, the compression configuration Conf_1 employed by the compressor 112_1 when the DDIC 104_1 is operated under the video mode is different from the compression configuration Conf_1' employed by the compressor 112_1 when the DDIC 104_1 is operated under the image/command mode. Specifically, the compression configuration Conf_1 includes an M-bit compression operation, and the compression configuration Conf_1' includes an N-bit compression operation, where M and N are different positive values. When optimization of the image quality in the video mode is considered, the value of N (e.g., 8) is smaller than the value of M (e.g., 10), thereby reducing the flicker artifacts visible in the video mode.

Similarly, the compression configuration Conf_2 employed by the compressor 112_2 when the DDIC 104_2 is operated under the video mode is different from the compression configuration Conf_2' employed by the compressor 112_2 when the DDIC 104_2 is operated under the image/command mode. Specifically, the compression configuration Conf_2 includes an M-bit compression operation, and the compression configuration Conf_2' includes an N-bit compression operation, where M and N are different positive values. When optimization of the image quality in the video mode is considered, the value of N (e.g., 8) is smaller than the value of M (e.g., 10), thereby reducing the flicker artifacts visible in the video mode.

The compression configuration Conf_3 employed by the compressor 112_3 when the DDIC 104_3 is operated under the video mode is different from the compression configuration Conf_3' employed by the compressor 112_3 when the DDIC 104_3 is operated under the image/command mode. Specifically, the compression configuration Conf_3 includes an M-bit compression operation, and the compression configuration Conf_3' includes an N-bit compression operation, where M and N are different positive values. When optimization of the image quality in the video mode is considered, the value of N (e.g., 8) is smaller than the value of M (e.g., 10), thereby reducing the flicker artifacts visible in the video mode.

In a third exemplary design, the compression configurations may be set based on the complexity optimization manner. For example, a high-complexity compression (e.g., a compression algorithm that can achieve better image quality) is applied to the display data D_IN2 corresponding to a central display port P_2. When a compressor employs a low-complexity compression, more artifacts will be introduced by the display data compression. In one exemplary embodiment, the compression configuration Conf_1 employed by the compressor 112_1 is different from the compression configuration Conf_2 employed by the compressor 112_2, and/or the compression configuration Conf_3 employed by the compressor 112_3 is different from the compression configuration Conf_2 employed by the compressor 112_2. Specifically, each of the compression configurations Conf_1 and Conf_3 includes a first compression algorithm, and the compression configuration Conf_2 includes a second compression algorithm, where the first compression algorithm and the second compression algorithm have different compression complexity. When optimization of the image quality of the partial display regions A_1-A_3 is considered, the second compression algorithm may be used to perform a standard display stream compression (DSC), and the first compression algorithm may be used to perform a light-weight compression. Compared to the light-weight compression, the standard DSC introduces fewer artifacts due to a more complex compression algorithm used. In this way, the artifacts visible in the central partial display region A_2 can be reduced.

For another example, a high-complexity compression (e.g., a compression algorithm that can achieve better image quality) is applied to a display data to be displayed in the video mode. When the compressor employs a low-complexity compression, more artifacts will be introduced by the display data compression. In one exemplary embodiment, the compression configuration Conf_1 employed by the compressor 112_1 when the DDIC 104_1 is operated under the video mode is different from the compression configuration Conf_1' employed by the compressor 112_1 when the DDIC 104_1 is operated under the image/command mode. Specifically, the compression configuration Conf_1' includes a first compression algorithm, and the compression configuration Conf_1 includes a second compression algorithm, where the first compression algorithm and the second compression algorithm have different compression complexity. When optimization of the image quality of the video mode is considered, the second compression algorithm may be used to perform a standard display stream compression (DSC), and the first compression algorithm may be used to perform a light-weight compression. Compared to the light-weight compression, the standard DSC introduces fewer artifacts due to a more complex compression algorithm used. In this way, the flicker artifacts visible in the video mode can be reduced.

Similarly, the compression configuration Conf_2 employed by the compressor 112_2 when the DDIC 104_2 is operated under the video mode is different from the compression configuration Conf_2' employed by the compressor 112_2 when the DDIC 104_2 is operated under the image/command mode. Specifically, the compression configuration Conf_2' includes a first compression algorithm, and the compression configuration Conf_2 includes a second compression algorithm, where the first compression algorithm and the second compression algorithm have different compression complexity. When optimization of the image quality of the video mode is considered, the second compression algorithm may be used to perform a standard display stream compression (DSC), and the first compression algorithm may be used to perform a light-weight compression. Compared to the light-weight compression, the standard DSC introduces fewer artifacts due to a more complex compression algorithm used. In this way, the flicker artifacts visible in the video mode can be reduced.

Further, the compression configuration Conf_3 employed by the compressor 112_3 when the DDIC 104_3 is operated under the video mode is different from the compression configuration Conf_3' employed by the compressor 112_3 when the DDIC 104_3 is operated under the image/command mode. Specifically, the compression configuration Conf_3' includes a first compression algorithm, and the compression configuration Conf_3 includes a second compression algorithm, where the first compression algorithm and the second compression algorithm have different compression complexity. When optimization of the image quality of the video mode is considered, the second compression algorithm may be used to perform a standard display stream compression (DSC), and the first compression algorithm may be used to perform a light-weight compression. Compared to the light-weight compression, the standard DSC introduces fewer artifacts due to a more complex compression algorithm used. In this way, the flicker artifacts visible in the video mode can be reduced.

Figure 2:
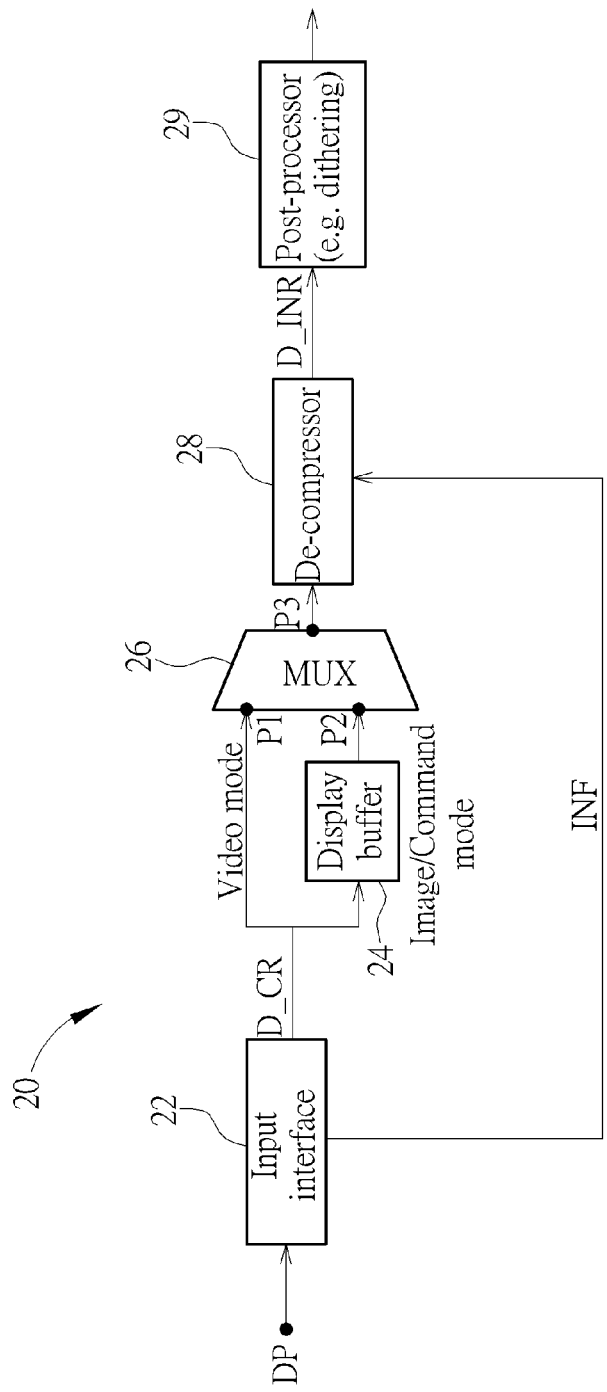
FIG. 2 is a diagram illustrating a display driver integrated circuit according to an embodiment of the present invention.

The DDICs 104_1-104_3 in FIG. 1 merely show some circuit components associated with two display driving modes such as a video mode and an image/command mode. In practice, each of the DDICs 104_1-104_3 has additional circuit components for performing an intended display driving function under the condition that the AP 102 is configured to transmit compressed data over the display interface 103. FIG. 2 is a diagram illustrating a display driver integrated circuit (DDIC) according an embodiment of the present invention. For example, each of the DDICs 104_1-104_3 in FIG. 1 may be implemented using the DDIC 20 shown in FIG. 2. In this embodiment, the DDIC 20 includes an input interface 22, a display buffer 24, a multiplexer (MUX) 26, a de-compressor 28, and a post-processor 29. The input interface 22 receives an input bitstream from one display port DP of a display interface (e.g., display interface 103), and un-packs the input bitstream into an input display data (e.g., a compressed display data D_CR).

When the DDIC 20 is operated in the video mode, the compressed display data D_CR derived from the input display data generated at the input interface 22 is transmitted to one input port P1 of the multiplexer P1. Hence, the display buffer 24 is not involved in driving a partial display region of a display panel in the video mode. When the DDIC 20 is operated in the image/command mode, the compressed display data D_CR derived from the input display data generated at the input interface 22 is stored into the display buffer 24, and the other input port P2 of the multiplexer 26 receives the compressed display data D_CR read from the display buffer 24. Hence, the display buffer 24 is involved in driving the partial display region of the display panel in the image/command mode.

The output port P3 of the multiplexer 26 is coupled to the de-compressor 28. Hence, the compressed display data D_CR received by one of the input ports P1 and P2 is transmitted to the de-compressor 28 for data decompression. In one exemplary design, side information INF indicative of a compression configuration employed by an application processor for generating the compressed display data D_CR is recorded in the input bitstream transmitted over the display interface. Hence, the side information INF parsed from the input bitstream received via the display port DP is provided to the de-compressor 28. In this way, the de-compressor 28 can refer to the side information INF to set a correct decompression method for de-compressing the compressed display data D_CR into a de-compressed display data D_INR.

Before being used for driving a partial display region of a display panel, the de-compressed display data D_INR may undergo certain post-processing. For example, the post-processor 29 may support a dithering function. When a partial-bit-depth compression (e.g., 8-bit compression) is employed by an application processor for generating a compressed display data to be transmitted over a display interface, the post-processor 29 may perform a dithering operation (e.g., 2-bit dithering operation) upon the de-compressed display data D_INR to recover a de-compressed display data with a full bit depth (e.g., 10 bits) in each color channel. However, when a full-bit-depth compression (e.g., 10-bit compression) is employed by an application processor for generating a compressed display data to be transmitted over a display interface, the post-processor 29 may bypass the de-compressed display data D_INR without applying any dithering operation to the de-compressed display data D_INR. It should be noted that the post-processor 29 may be optional, depending upon actual design requirement. For example, when the AP side does not support the partial-bit-depth compression, the DDIC 20 may be modified to omit the post-processor 29.

Consider a case where each of the DDICs 104_1-104_3 shown in FIG. 1 has the exemplary circuit configuration shown in FIG. 2. The display buffers 116_1-116_3 are used to store compressed data transmitted over the display interface 103 and then provide the buffered compressed data to de-compressors through the multiplexers 118_1-118_3, respectively. The present invention further proposes controlling the compression configurations employed by the compressors 112_1-112_3 in terms of display buffer capacity. As mentioned above, the display buffers 116_1-116_3 are used in the image/command mode for display data buffering, but are not used in the video mode for display data buffering. Hence, the compression configurations are not the same for different display driving modes (e.g., video mode and image/command mode).

In a first exemplary design, the compression configurations may be set based on the rate optimization manner. For example, an aggressive compression ratio (i.e., a higher compression ratio) may be applied to a display data to be displayed in the image/command mode. As mentioned above, the compression ratio may be defined as $$\frac{\text{Uncompressed data size}}{\text{Compressed data size}}.$$

Hence, when the display data compression with a higher compression ratio is employed, the compressed data size in the image/command mode would be smaller, thus allowing a display buffer to have a smaller buffer size.

The compression configuration Conf_1 employed by the compressor 112_1 when the DDIC 104_1 is operated under the video mode is different from the compression configuration Conf_1' employed by the compressor 112_1 when the DDIC 104_1 is operated under the image/command mode. Specifically, the compression configuration Conf_1 includes a first compression ratio, and the compression configuration Conf_1' includes a second compression ratio, where the second compression ratio is different from the first compression ratio. When optimization of the display buffer capacity is considered, the second compression ratio (e.g., 3) is higher than the first compression ratio (e.g., 2), thereby satisfying the display buffer size requirement in the image/command mode.

Similarly, the compression configuration Conf_2 employed by the compressor 112_2 when the DDIC 104_2 is operated under the video mode is different from the compression configuration Conf_2' employed by the compressor 112_2 when the DDIC 104_2 is operated under the image/command mode. Specifically, the compression configuration Conf_2 includes a first compression ratio, and the compression configuration Conf_2' includes a second compression ratio, where the second compression ratio is different from the first compression ratio. When optimization of the display buffer capacity is considered, the second compression ratio (e.g., 3) is higher than the first compression ratio (e.g., 2), thereby satisfying the display buffer size requirement in the image/command mode.

Further, the compression configuration Conf_3 employed by the compressor 112_3 when the DDIC 104_3 is operated under the video mode is different from the compression configuration Conf_3' employed by the compressor 112_3 when the DDIC 104_3 is operated under the image/command mode. Specifically, the compression configuration Conf_3 includes a first compression ratio, and the compression configuration Conf_3' includes a second compression ratio, where the second compression ratio is different from the first compression ratio. When optimization of the display buffer capacity is considered, the second compression ratio (e.g., 3) is higher than the first compression ratio (e.g., 2), thereby satisfying the display buffer size requirement in the image/command mode.

In a second exemplary design, the compression configurations may be set based on the bit-depth optimization manner. For example, a partial-bit-depth compression ratio is applied to a display data to be displayed in the image/command mode. Consider a case where a 10-bit data source provides a display data to a compressor. When the compressor employs an 8-bit (partial-bit-depth) compression, the compressed data size would be smaller, thus allowing a display buffer to have a smaller buffer size.

The compression configuration Conf_1 employed by the compressor 112_1 when the DDIC 104_1 is operated under the video mode is different from the compression configuration Conf_1' employed by the compressor 112_1 when the DDIC 104_1 is operated under the image/command mode. Specifically, the compression configuration Conf_1 includes an M-bit compression operation, and the compression configuration Conf_1' includes an N-bit compression operation, where M and N are different positive values. When optimization the display buffer capacity is considered, the value of N (e.g., 8) is smaller than the value of M (e.g., 10), thereby satisfying the display buffer size requirement in the image/command mode.

Similarly, the compression configuration Conf_2 employed by the compressor 112_2 when the DDIC 104_2 is operated under the video mode is different from the compression configuration Conf_2' employed by the compressor 112_2 when the DDIC 104_2 is operated under the image/command mode. Specifically, the compression configuration Conf_2 includes an M-bit compression operation, and the compression configuration Conf_2' includes an N-bit compression operation, where M and N are different positive values. When optimization of the display buffer capacity is considered, the value of N (e.g., 8) is smaller than the value of M (e.g., 10), thereby satisfying the display buffer size requirement in the image/command mode.

Further, the compression configuration Conf_3 employed by the compressor 112_3 when the DDIC 104_3 is operated under the video mode is different from the compression configuration Conf_3' employed by the compressor 112_3 when the DDIC 104_3 is operated under the image/command mode. Specifically, the compression configuration Conf_3 includes an M-bit compression operation, and the compression configuration Conf_3' includes an N-bit compression operation, where M and N are different positive values. When optimization of the display buffer capacity is considered, the value of N (e.g., 8) is smaller than the value of M (e.g., 10), thereby satisfying the display buffer size requirement in the image/command mode.

Figure 3:
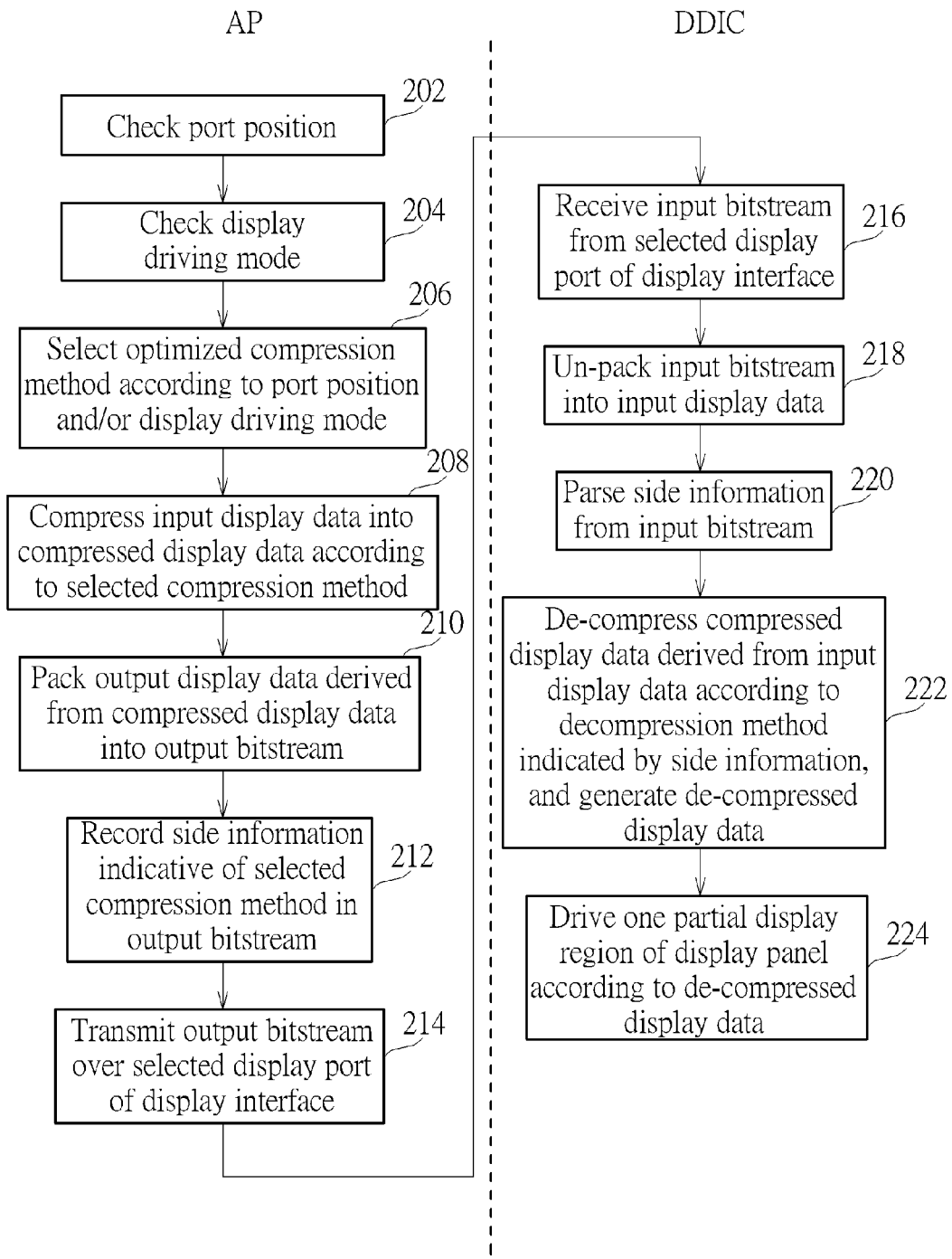
FIG. 3 is a diagram illustrating a data processing method according to an embodiment of the present invention.

FIG. 3 is a diagram illustrating a data processing method according to an embodiment of the present invention. Provided that the result is substantially the same, the steps are not required to be executed in the exact order shown in FIG. 3. The data processing method may be employed by the data processing system 100 shown in FIG. 1, and may be briefly summarized as below.

Step 202: Check a port position.

Step 204: Check a display driving mode.

Step 206: Select an optimized compression method according to the port position and/or the display driving mode. For example, a compression configuration of a compressor may be set according to at least one of a rate optimization manner, a bit-depth optimization manner, and a complexity optimization manner.

Step 208: Compress an input display data into a compressed display data according to the selected compression method.

Step 210: Pack an output display data derived from the compressed display data into an output bitstream.

Step 212: Record side information indicative of the selected compression method in the output bitstream.

Step 214: Transmit the output bitstream over a selected display port of a display interface.

Step 216: Receive an input bitstream from the selected display port of the display interface.

Step 218: Un-pack the input bitstream into an input display data.

Step 220: Parse the side information from the input bitstream.

Step 224: De-compress a compressed display data derived from the input display data according to a decompression method indicated by the side information, and generate a de-compressed display data.

Step 226: Drive one partial display region of a display panel according to the de-compressed display data.

Steps 202-214 are performed at the AP side (i.e., the encoder side), and steps 216-226 are performed at the DDIC side (i.e., the decoder side). Steps 202-206 are performed to determine a proper compression configuration of a compressor to achieve compression optimization for image quality and/or display buffer capacity. In one exemplary implementation, the port position and the display driving mode are both considered to decide a compression configuration of a corresponding compressor in the AP 102. In another exemplary implementation, only one of the port position and the display driving mode is considered to decide a compression configuration of a corresponding compressor in the AP 102.

Since the AP 102 has compressors 112_1-112_3 implemented to generate compressed display data for transmission over the display interface 103, the DDICs 104_1-104_3 are equipped with decompression capability to obtain de-compressed display data for driving partial display regions A_1-A_3 of the display panel 101. For example, one de-compressor may be coupled to an output port of each of the multiplexers 118_1-118_3. Hence, when an input bitstream is received by one DDIC from a selected display port of the display interface 103, a compressed display data is derived from up-packing the input bitstream, and a de-compressed display data is derived from applying decompression to the compressed display data, where the de-compressed display data is used for driving one partial display region of the display panel 101.

It should be noted that the output interface 114_1/114_2/114_3 may further receive side information INF_1/INF_2/INF_3 indicative of a compression configuration (i.e., an optimized compression method) selected by the corresponding compressor 112_1/112_2/112_3 based on the port position and/or the display driving mode, and record the side information INF_1/INF_2/INF_3 in the output bitstream transmitted to the DDIC 104_1/104_1/104_3. Hence, the side information INF_1/INF_2/INF_3 is transmitted from the AP 102 to the DDIC 104_1/104_2/104_3 for informing the DDIC 104_1/104_2/104_3 of the optimized compression method used by the compressor 112_1112_2/112_3. A de-compressor of the DDIC 104_1/104_2/104_3 (e.g., de-compressor 28 of DDIC 20 shown in FIG. 2) can refer to the side information INF_1/INF_2/INF_3 parsed from the received input bitstream to set a correct decompression method for de-compressing the compressed display data transmitted over the display interface 103. In addition, when a partial-bit-depth compression operation is performed at the AP side, a post-processor of the DDIC 104_1/104_2/104_3 (e.g., post-processor 29 of DDIC 20 shown in FIG. 2) may perform a post-processing operation (e.g., a dithering operation) upon the de-compressed display data.

As a person skilled in the art can readily understand details of each step shown in FIG. 3 after reading above paragraphs, further description is omitted here for brevity.

As mentioned above, a display buffer implemented in a DDIC may be used to store compressed display data. Hence, a compression method used by an AP may be adjusted to satisfy the display buffer size requirement. In an alternative design, a compression method used by an AP may have a fixed compression ratio, and a display buffer implemented in a DDIC may have a fixed buffer size. As a result, it is possible that the compression data size may exceed the buffer size of the display buffer implemented in the DDIC. The present invention further proposes using a transcoding technique in the DDIC for allowing a compressed display data to be fully stored in the display buffer.

Figure 4:
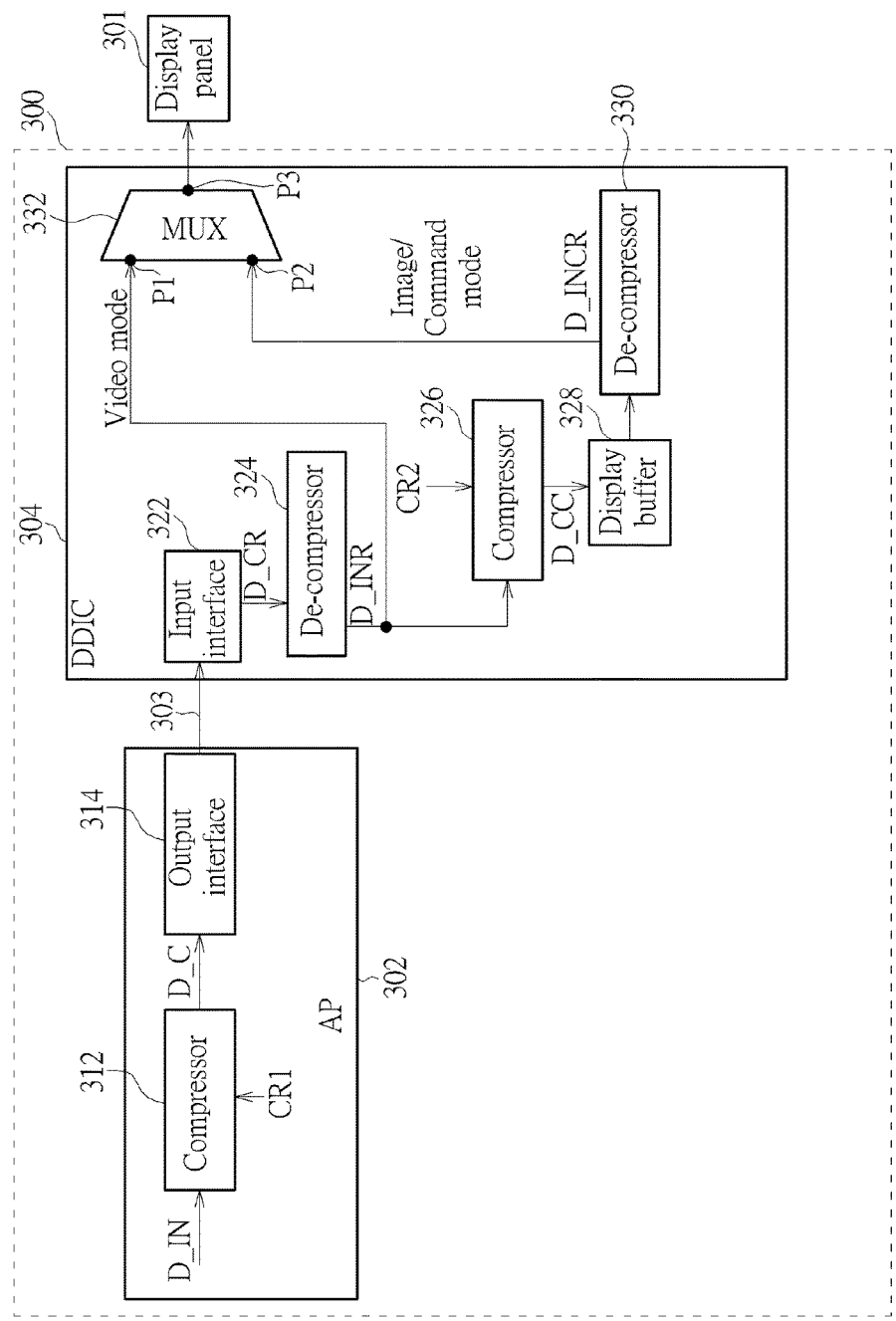
FIG. 4 is a block diagram illustrating another data processing system according to an embodiment of the present invention.

FIG. 4 is a block diagram illustrating another data processing system according to an embodiment of the present invention. The data processing system 300 includes a plurality of data processing apparatuses such as an application processor (AP) 302 and a display driver integrated circuit (DDIC) 304. The AP 302 and the DDIC 304 may be implemented in different chips, and the AP 302 communicates with the DDIC 304 via a display interface 303. In this embodiment, the display interface 303 may be a display serial interface (DSI) standardized by a Mobile Industry Processor Interface (MIPI) or an embedded display port (eDP) standardized by a Video Electronics Standards Association (VESA).

In this embodiment, the AP 302 includes a compressor 312 and an output interface 314. The compressor 312 receives an input display data D_IN (e.g., uncompressed display data of one frame), and perform compression upon the input display data D_IN to generate a compressed display data D_C (e.g., compressed display data of one frame), where the compression performed by the compressor 312 is a lossy compression operation with a fixed compression ratio CR1. A compression ratio may be defined as $$\frac{\text{Uncompressed data size}}{\text{Compressed data size}}.$$

Hence, $$CR1 = \frac{\text{Size of D\_IN}}{\text{Size of D\_C}}.$$

The output interface 314 packs an output display data derived from the compressed display data D_C into an output bitstream, and outputs the output bitstream to the DDIC 304 via the display interface 303.

The DDIC 304 includes an input interface 322, a plurality of de-compressors 324, 330, a compressor 326, a display buffer 328, and a multiplexer (MUX) 332. The input interface 322 receives an input bitstream via the display interface 303, and un-packs the input bitstream into an input display data (e.g., a compressed display data D_CR). If there is no error occurring during the data transmission over the display interface 303, the compressed display data D_CR recovered at the DDIC side should be identical to the compressed display data D_C generated at the AP side. The display buffer 328 implemented in the DDIC 304 has a fixed buffer size. The compressed data transmission between the AP 302 and the DDIC 304 can reduce the power consumption of the display interface 303. However, if the AP 302 and the DDIC 304 are designed by different companies, the compression ratio CR1 provided by the compressor 312 in the APA 302 is set without considering the buffer size of the display buffer 328 in the DDIC 304. It is possible that the size of the compressed display data D_C generated from the compressor 312 exceeds the buffer size of the display buffer 328. For example, the fixed buffer size may be equal to $$\frac{1}{N} \times \text{Size of D\_IN},$$

where N>CR1. Hence, the size of the compressed display data D_C (or D_CR) is larger than the fixed buffer size of the display buffer 328. The compressed display data D_CR recovered at the DDIC side cannot be fully stored in the display buffer 328.

In a case where the compression performed by the compressor 312 at the AP side has the fixed compression ratio CR1 and the display buffer 328 at the DDIC side has the fixed buffer size smaller than the size of the compressed display data of one frame, the present invention proposes using a transcoding technique at the DDIC side for applying an aggressive compression ratio (e.g., a higher compression ratio) to the display data needed to be stored into the display buffer 328 in the image/command mode. Further details of the proposed transcoding technique are described as below.

In this embodiment, the de-compressor 324 performs decompression upon the compressed display data D_CR (e.g., compressed display data of one frame) to generate a de-compressed display data D_INR (e.g., de-compressed display data of one frame). When the DDIC 304 is operated in the video mode, the de-compressor 324 outputs the de-compressed display data D_INR to one input port P1 of the multiplexer 322, and the multiplexer 332 outputs the de-compressed display data D_INR received by the input port P1 for driving the display panel 301.

When the DDIC 304 is operated in the image/command mode, the de-compressor 324 outputs the de-compressed display data D_INR to the compressor 326. Next, the compressor 312 performs compression upon the de-compressed display data (e.g., de-compressed display data of one frame) to generate a compressed display data D_CC (e.g., transcoded display data of one frame), where the compression performed by the compressor 326 is a lossy compression operation with a fixed compression ratio CR2 different from the fixed compression ratio CR1. The fixed compression ratio CR2 may be set based on the fixed buffer size of the display buffer 328 and the uncompressed data size (e.g., the size of the input display data D_IN). For example, when the fixed buffer size is equal to $$\frac{1}{N} \times \text{Size of D\_IN},$$

the fixed compression ratio CR2 may be set by a value that is not smaller than N. In this way, the compressed display data D_CC (e.g., transcoded display data of one frame) is ensured to be fully stored in the display buffer 328. The de-compressor 330 performs decompression upon the compressed display data D_CC read from the display buffer 328 to generate a de-compressed display data D_INCR to another input port P2 of the multiplexer 332, and the multiplexer 332 outputs the de-compressed display data D_INCR received by the input port P2 for driving the display panel 301.

Figure 5:
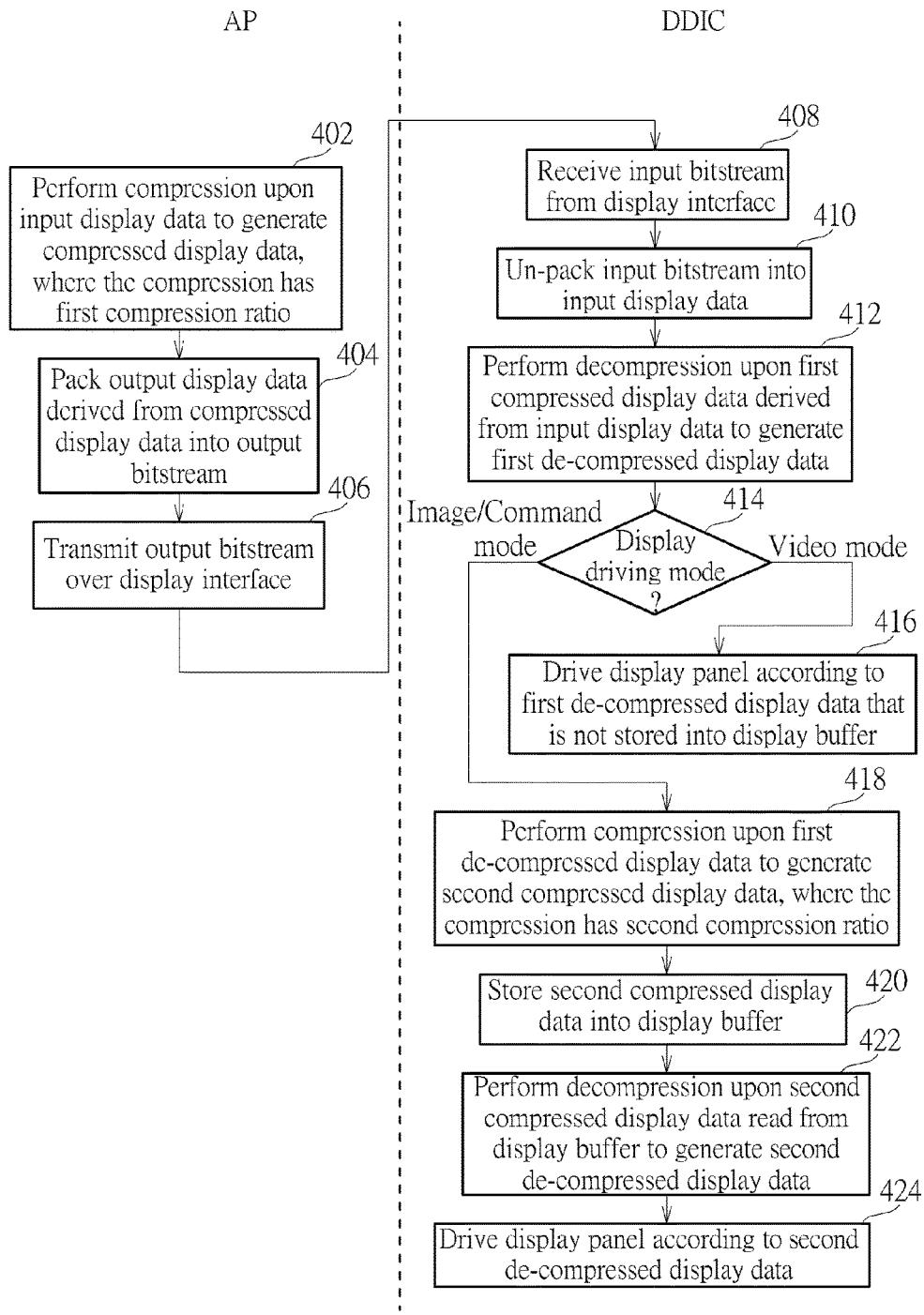
FIG. 5 is a diagram illustrating another data processing method according to an embodiment of the present invention.

FIG. 5 is a diagram illustrating another data processing method according to an embodiment of the present invention. Provided that the result is substantially the same, the steps are not required to be executed in the exact order shown in FIG. 5. The data processing method may be employed by the data processing system 300 shown in FIG. 4, and may be briefly summarized as below.

Step 402: Perform compression upon an input display data to generate a compressed display data, where the compression has a first compression ratio.

Step 404: Pack an output display data derived from the compressed display data into an output bitstream.

Step 406: Transmit the output bitstream over a display interface.

Step 408: Receive an input bitstream from the display interface.

Step 410: Un-pack the input bitstream into an input display data.

Step 412: Perform decompression upon a first compressed display data derived from the input display data to generate a first de-compressed display data.

Step 414: Check a display driving mode. If the display driving mode is a video mode, go to step 416. If the display driving mode is an image/command mode, go to step 418.

Step 416: Drive a display panel according to the first de-compressed display data that is not stored into a display buffer.

Step 418: Perform compression upon the first de-compressed display data to generate a second compressed display data, where the compression has a second compression ratio different from (e.g., larger than) the first compression ratio.

Step 420: Store the second compressed display data into the display buffer.

Step 422: Perform decompression upon the second compressed display data read from the display buffer to generate a second de-compressed display data.

Step 424: Drive the display panel according to the second de-compressed display data.

Steps 402-406 are performed at the AP side (i.e., the encoder side), and steps 408-424 are performed at the DDIC side (i.e., the decoder side). As a person skilled in the art can readily understand details of each step shown in FIG. 5 after reading above paragraphs, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A data processing apparatus comprising:
   a compressor, arranged to perform compression upon an input display data to generate a compressed display data; and
   an output interface, arranged to pack an output display data derived from the compressed display data into an output bitstream, and output the output bitstream to another data processing apparatus via a display interface;
   wherein when the another data processing apparatus is operated under a first mode to drive a display apparatus through a first hardware configuration of the another data processing apparatus, the compression performed by the compressor has a first compression configuration; when the another data processing apparatus is operated under a second mode to drive the display apparatus through a second hardware configuration of the another data processing apparatus, the compression performed by the compressor has a second compression configuration; the first hardware configuration is different from the second hardware configuration; and the first compression configuration is different from the second compression configuration;

wherein when the another data processing apparatus is operated under the first mode, the first hardware configuration of the another data processing apparatus has a display buffer involved in driving the display apparatus; and when the another data processing apparatus is operated under the second mode, the second hardware configuration of the another data processing apparatus does not have the display buffer involved in driving the display apparatus.

2. The data processing apparatus of claim 1, wherein the display interface is a display serial interface (DSI) standardized by a Mobile Industry Processor Interface (MIPI) or an embedded display port (eDP) standardized by a Video Electronics Standards Association (VESA).

3. The data processing apparatus of claim 1, wherein the first compression configuration comprises a first compression ratio, the second compression configuration comprises a second compression ratio, and the first compression ratio is different from the second compression ratio.

4. The data processing apparatus of claim 1, wherein the first compression configuration comprises an N-bit compression operation, the second compression configuration comprises an M-bit compression operation, and N and M are different positive values.

5. The data processing apparatus of claim 1, wherein the first compression configuration comprises a first compression algorithm, the second compression configuration comprises a second compression algorithm, and the first compression algorithm and the second compression algorithm have different compression complexity.

6. A data processing method comprising:
   utilizing a compressor to perform compression upon an input display data to generate a compressed display data; and
   packing an output display data derived from the compressed display data into an output bitstream, and outputting the output bitstream to another data processing apparatus via a display interface;
   wherein when the another data processing apparatus is operated under a first mode to drive a display apparatus through a first hardware configuration of the another data processing apparatus, the compression performed by the compressor has a first compression configuration; when the another data processing apparatus is operated under a second mode to drive the display apparatus through a second hardware configuration of the another data processing apparatus, the compression performed by the compressor has a second compression configuration; the first hardware configuration is different from the second hardware configuration; and the first compression configuration is different from the second compression configuration;
   wherein when the another data processing apparatus is operated under the first mode, the first hardware configuration of the another data processing apparatus has a display buffer involved in driving the display apparatus; and when the another data processing apparatus is operated under the second mode, the second hardware configuration of the another data processing apparatus does not have the display buffer involved in driving the display apparatus.

7. The data processing method of claim 6, wherein the display interface is a display serial interface (DSI) standardized by a Mobile Industry Processor Interface (MIPI) or an embedded display port (eDP) standardized by a Video Electronics Standards Association (VESA).

* * * * *